United States Patent [19]
Hashimoto et al.

[11] Patent Number: 5,401,932
[45] Date of Patent: Mar. 28, 1995

[54] METHOD OF PRODUCING A STENCIL MASK

[75] Inventors: Kazuhiko Hashimoto; Masayuki Endo; Masaru Sasago, all of Osaka, Japan

[73] Assignee: Matsushita Electric Industrial Co., Ltd., Osaka, Japan

[21] Appl. No.: 13,100

[22] Filed: Feb. 3, 1993

[30] Foreign Application Priority Data

Feb. 7, 1992 [JP] Japan .................................. 4-022302
Jul. 17, 1992 [JP] Japan .................................. 4-190427

[51] Int. Cl.$^6$ .......................... B23H 1/00; B23H 9/14; G03F 1/16
[52] U.S. Cl. .................. 219/69.17; 156/644; 156/657; 430/5
[58] Field of Search .......... 219/69.17, 69.2, 121.25; 156/644, 654, 657, 662; 430/5

[56] References Cited

U.S. PATENT DOCUMENTS

| | | | |
|---|---|---|---|
| 3,988,153 | 10/1976 | Politycki | 156/644 |
| 4,256,532 | 3/1981 | Magdo et al. | 156/644 |
| 4,685,185 | 8/1987 | Boso et al. | 219/69.17 |
| 4,855,197 | 8/1989 | Zapka et al. | 430/5 |
| 4,861,422 | 8/1989 | Kudou et al. | 156/644 |
| 4,957,835 | 9/1990 | Aden | 430/5 |
| 5,173,582 | 12/1992 | Sakamoto et al. | 219/121.25 |
| 5,234,781 | 8/1993 | Sakamoto et al. | 430/5 |
| 5,326,663 | 7/1994 | Tanaka et al. | 156/644 |

FOREIGN PATENT DOCUMENTS 59-59318 4/1984 Japan .................. 219/69.17

OTHER PUBLICATIONS

King et al., "An Electron Beam Lithography System For Submicron VHSIC Device Fabrication", J. Vac. Sci. Technology B 3(1), pp. 106–111, (Jan./Feb. 1985).
Nakayama et al., "Electron-Beam Cell Projection Lithography: A New High-Throughput Electron-Beam Direct-Writing Technology Using A Specially Tailored Si Aperture", J. Vac. Sci. Technology, B 8(6), pp. 1836–1840, (Nov./Dec. 1990).

*Primary Examiner*—Geoffrey S. Evans
*Attorney, Agent, or Firm*—Willian Brinks Hofer Gilson & Lione

[57] ABSTRACT

The reverse side of a substrate made of stainless steel is subjected to electro-discharge machining using a thick electrode having a diameter of about 10 μm, thus selectively etching other part than the edge of the reverse side of the substrate. This electro-discharge machining causes the other part than the edge of the substrate to be thinned to a thickness of about 10 μm. The surface of the substrate thus thinned is subjected to electro-discharge machining using a slender electrode having a diameter of about 3 μm, thus forming a pattern having a predetermined configuration in the surface of the substrate. Further, the surface of the substrate is etched with the use of the slender electrode, so that the pattern of the silicon substrate is pierced, thus forming a pattern having vertical through-holes. Thus, by using, as a mask material, a substrate solely made of stainless steel as it is, there can be produced a stencil mask which is excellent in mechanical strength and thermal stability and which is not thermally distorted.

10 Claims, 7 Drawing Sheets

METHOD OF PRODUCING A STENCIL MASK

BACKGROUND OF THE INVENTION

The present invention relates to a method of producing a stencil mask to be used in a reduction projection printing lithography using a high-energy beam such as an ion beam, an electron beam or the like for carrying out a microfabrication on a semiconductor device.

A lithography technology using a high-energy beam such as an electron beam is not required to use a reticle and can form a fine pattern. Accordingly such a technology is used as means for a development of LSIs.

An electron beam direct writing method which has been conventionally widely used, is a so-called single writing method by which patterns are successively written one by one by a Gaussian beam (point beam) or a variable shaped beam using an electron gun of the field emission type or a thermal electron gun. More specifically, an electron beam emitted from an electron gun is condensed in the form of a slender beam spot on a resist by a condensor lens, and a deflection system controls the position of the beam spot, so that an arbitrary figure can be written on the resist.

This method can electrically correct distortion or aberration inside of a deflection field, thus advantageously enhancing the precision dependent on a control technology. Accordingly, this method has been developed in various manners and put in practical use. As shown in Journal Vacuum Science and Technology, B3 p. 106 by H. J. King et al (1985), a fine pattern not greater than 0.5 $\mu$m can be optionally formed by pattern data with the use of an electron beam direct writing method.

According to this method, however, the spot diameter of the electron beam is about 0.1 to about 2 $\mu$m. Thus, as a pattern to be written is reduced in size, the number of spots to be written is increased and subsequently, the number of pattern data is considerably increased. Further, due to limits of the working frequency of the deflection system, the spot moving speed is limited to a certain level, thus taking considerable time for writing. This disadvantageously lowers the throughput.

To solve the defects above-mentioned, there has been recently proposed, instead of a method of writing all patterns of an LSI chip in a manner like a single writing manner, a method of reduction-projection printing a pattern to be repeated with the use of a stencil mask.

FIG. 5 shows a method comprising the steps of dividing repeat areas of an LSI chip pattern into small-area partial patterns, forming each of the partial patterns on a stencil mask, and successively printing the partial patterns on a wafer with the use of the stencil masks. In FIG. 5, there is disposed an electron gun 50 for emitting an electron beam, a first aperture 51 for stopping down an electron beam, a printing lens 52, a deflection plate 53, a stencil mask 54 in which a partial pattern to be printed is formed, a reducing lens 55, a second aperture 56, an object lens 57, and a wafer 58 on which is printed an electron beam having passed through the partial pattern in the stencil mask.

According to this reduction projection printing method, the throughput becomes very fast, but the production of a stencil mask is very difficult.

The following description will discuss an example of a conventional stencil mask producing method with reference to FIGS. 6(a)-(c).

As shown in FIG. 6 (a), boron ions 61 are implanted to the surface of a semiconductor substrate 60 in a dose amount of $1 \times 10^{20}$ cm with an accelerating voltage of 50 to 100 KV applied, thus forming an ion implantation layer 62. As shown in FIG. 6 (b), an epitaxial layer 63 of silicon is formed on the surface of the ion implantation layer 62, and a surface protective film 64 of silicon nitride and a reverse protective film 65 of silicon nitride are then respectively formed on the top of the epitaxial layer 63 and the reverse side of the semiconductor substrate 60.

With the use of lithography and etching, the reverse protective film 65 is selectively removed. With the remaining portion of the reverse protective film 65 serving as a mask, the reverse side of the semiconductor substrate 60 is then etched up to the ion implantation layer 62 with an ethylene diamine-pirocatechol solution, thus removing the surface protective film 64 and all the remaining portions of the reverse protective film 65, as shown in FIG. 6 (c).

As shown in FIG. 6 (d), a resist pattern 66 is formed on the epitaxial layer 63 with the use of an electron beam lithography technology. As shown in FIG. 6(e), with the resist pattern 66 used as a mask, the epitaxial layer 63 and the ion implantation layer 62 are etched to form a through-hole pattern 67, and then the resist pattern 66 is removed. To prevent the charge from being increased by the electron beam, gold may be evaporated on the surface of the epitaxial layer 63.

According to the method above-mentioned, there a stencil mask to be used in an electron beam reduction projection printing lithography is obtained.

However, this method requires an epitaxial technology and a high-energy ion implantation technology. Accordingly, this method is considerably complicated in technical point of view and takes considerable time.

Further, this method requires that the surface and reverse protective films 64, 65 are deposited and that only the epitaxial layer 63 and the ion implantation layer 62 of the semiconductor substrate 60 form a mask for shielding an electron beam. This causes the thickness of the mask to become dozen $\mu$m or more. Accordingly, depositing and etching the epitaxial layer 63 are not facilitated.

As shown in Journal Vacuum Science and Technology, B8 p. 1836 by Y. Nakayama et al (1990), there has been proposed a method of etching a semiconductor substrate from the reverse side thereof, instead of using an epitaxial layer of a semiconductor substrate. According to such a method, it is difficult not only to control the thickness of a semiconductor substrate, but also to uniformly etch the semiconductor substrate. Also, it is difficult to vertically etch a semiconductor substrate over a dozen $\mu$m or more.

FIG. 7 shows the projection ranges of electrons inside of silicon, tungsten, gold and stainless steel with respect to the accelerating voltages of electron beam. Normally, the accelerating voltage used in electron beam lithography is from 20 to 50 keV. Accordingly, when silicon is used as a mask, the silicon is required to have a thickness of about 20 $\mu$m. However, it is very difficult to vertically etch silicon having a thickness of dozen $\mu$m or more. Further, when silicon is used as a mask, it requires a great number of steps of ion implantation, epitaxial, lithography, etching and the like. Accordingly, a stencil mask producing method using a silicon process is disadvantageously complicated to process.

In this connection, there may be made a proposal in which metal is deposited on the surface of a silicon substrate and a mask is made in the form of a multi-layer film, thus reducing the silicon film in thickness.

However, gold cannot be etched and therefore can only be deposited on the mask surface. Further, as impurities in a semiconductor silicon process, gold is very difficult to handle. Also, gold presents an thermal expansion of $14.2 \times 10^{-6}$/deg while silicon presents a thermal expansion of $2.5 \times 10^{-6}$, and gold presents a thermal conductivity of $3.1$ cm$\times$deg while silicon presents a thermal conductivity of $1.7$ cm$\times$deg. When a mask is irradiated by an electron beam, heat is subsequently generated to deform the mask. When gold is deposited on a silicon mask, the mask might be distorted. Further, making a mask in the form of a multi-layer film is disadvantageous because the process is complicated.

SUMMARY OF THE INVENTION

The present invention is proposed to overcome the problems above-mentioned and relates to a method of producing a stencil mask which is provided with a through-hole pattern having a predetermined configuration and which is used for forming a resist pattern on a resist on a semiconductor substrate by a high-energy beam such as an ion beam, an electron beam or the like which passes through the through-hole pattern. It is an object of the present invention to provide a method of producing a stencil mask which minimizes thickness, which provides sufficient mechanical strength, which is excellent in dimensional and thermal stabilities with respect to changes in temperature, and which can be produced in a simple process.

To achieve the object above-mentioned, a first method according to the present invention comprises: a first step of selectively etching the reverse side of a substrate, thus thinning a region of the substrate, but not the edge of the substrate; and a second step of selectively subjecting the thinned surface to electro-discharge machining using a slender electrode, thus forming a through-hole pattern having a predetermined configuration in the thinned region of the substrate.

A second method according to the present invention comprises: a first step of selectively subjecting the surface of a substrate, but not the edge of the substrate, to electro-discharge machining using a electrode, thus forming a concave pattern having a predetermined configuration in the region other part than the edge of the substrate; and a second step of selectively etching the reverse side of the substrate, thus thinning the region other part than the edge of the substrate, so that the concave pattern is converted into a through-hole pattern.

According to each of the first and second methods of the present invention, a through-hole pattern is formed in the surface of a substrate by an electro-discharge technology without use of lithography. It is therefore possible to readily produce a stencil mask for reduction projection printing lithography.

When subjecting silicon to electro-discharge machining, the electro-discharge machining can be applied to silicon having an aspect ratio of up to about 20 and can form a through-hole pattern having a width of not greater than 3 $\mu$m. For example, in a 1/50 reduction exposure, it is enough that, in order to form a resist pattern of 0.1 $\mu$m, a pattern of 5 $\mu$m is previously prepared as a mask and the thickness of a film for shielding an electron beam is about 20 $\mu$m.

Further, since the through-hole pattern is formed by electro-discharge machining, a pattern having vertical through-holes can be readily formed.

Further, since an electro-discharge technology is used, it is possible to readily produce an accurate stencil mask excellent in mechanical strength and dimensional and thermal stabilities with respect to changes in temperature, even though the mask is reduced in thickness.

Further, since the through-hole pattern is formed by electro-discharge machining, there can be used, as a substrate, metals such as tungsten, stainless steel or the like, instead of silicon.

According to each of the first and second methods of the present invention, the reverse side of the substrate may be subjected to electro-discharge machining using a thick electrode having a diameter of 5 to 50 $\mu$m for example, thus thinning the region other than the edge of the substrate. In this case, the thickness of a mask portion of the substrate can be readily controlled.

According to each of the first and second methods of the present invention, the region other than the edge of a substrate made of a semiconductor may be thinned by the steps of: forming an inorganic film on the reverse side of the substrate; forming a resist pattern at the edge of the reverse side of the inorganic film by lithography; etching and removing the region other than the edge of the inorganic film with the resist pattern serving as a mask, thus causing the region of the reverse side of the substrate to be exposed; and wet-etching the reverse side of the substrate.

DETAILED DESCRIPTION OF THE INVENTION

The present invention provides a stencil mask producing method by which a body solely made of a single material of silicon or metal is subjected to electro-discharge machining, thus readily producing a thin and highly practical stencil mask presenting no thermal strain. According to the method of the present invention, since a through-hole pattern having a width of 1 to 10 μm is formed in a silicon substrate by electro-discharge machining, it is possible to form an accurate pattern having vertical through-holes.

When the body is a silicon substrate, it is enough that the thickness of a film for shielding an electron beam is not greater than 30 μm, for example in the range from about 20 to about 30 μm. When an electro-discharge technology or dry-etching technology is used in order to thin the reverse side of a silicon substrate by etching, the thickness of the silicon substrate can be controlled to a desired thickness with high precision.

Since the stencil mask is solely made of a single material, there is no possibility of the stencil mask being distorted due to an influence of heat from a high-energy beam such as an electron beam. Further, since the through-hole pattern is formed with the use of an electro-discharge technology, a metal material such as tungsten, stainless steel or the like may be used instead of silicon. Accordingly, there can be readily produced a stencil mask having an accurate pattern for reduction projection printing lithography.

Figure 1A:
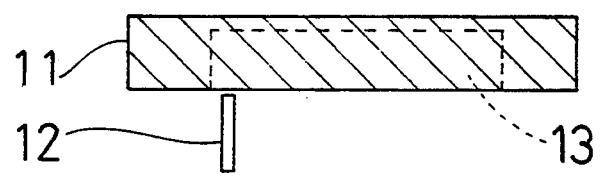
FIGS. 1(a)–1(c) are section views illustrating the respective steps of a stencil mask producing method according to a first embodiment of the present invention.
Figure 1B:
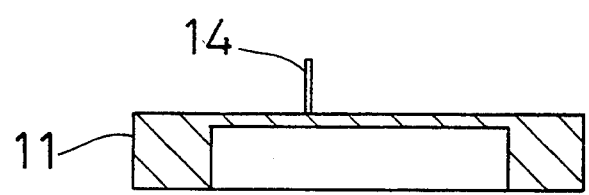
Figure 1C:
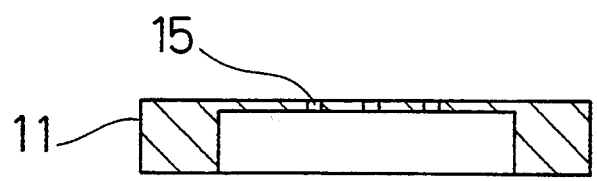

The following description will discuss a stencil mask producing method according to a first embodiment of the present invention with reference to (FIGS. 1(a)–1(c).

FIG. 1 is a section view illustrating the respective steps of the stencil mask producing method according to the first embodiment of the present invention.

As a substrate 11, stainless steel having a thickness of about 300 μm is used. As shown in FIG. 1 (a), the substrate 11 is subjected to electro-discharge machining using an electro-discharge-machining electrode 12 having a great diameter of about 10 μm, thus selectively removing a hatched portion 13 of the substrate 11 except for the edge thereof. By this electro-discharge machining, the region other than the edge of the substrate 11 is thinned to a thickness of about 10 μm.

As shown in FIG. 1(b), the surface of the substrate 11 thus thinned is subjected to electro-discharge machining using an electro-discharge-machining electrode 14 having a small diameter of about 3 μm, thus forming a pattern having a predetermined configuration on the surface of the substrate 11. The portion of the substrate 11 having the pattern thus formed, is then etched using the electro-discharge-machining electrode 14, thus forming a pattern 15 having vertical through-holes in the region other than the edge of the substrate 11, as shown in FIG. 1(c).

Thus, while the processing steps are considerably simplified, there can be obtained a stencil mask excellent in mechanical strength by using, as a mask material, the substrate 11 solely made of stainless steel as it is. The stencil mask thus obtained is solely made of stainless steel. Accordingly, even though the stencil mask is irradiated by an electron beam having an accelerating voltage of 50 keV, the stencil mask is not thermally distorted and is therefore very high in thermal stability.

According to the first embodiment having the arrangement above-mentioned, by subjecting the substrate 11 solely made of stainless steel to an electro-discharge technology, produces a practical stencil mask for reduction projection printing lithography which is excellent in mechanical strength and thermal stability and which is not thermally distorted. According to the first embodiment, the substrate 11 is subjected, at the reverse side thereof, to an electro-discharge technology to etch the reverse side of the substrate 11. Accordingly, the thickness of the substrate 11 can be controlled with high precision. By an electro-discharge technology, the substrate 11 is thinned and the through-hole pattern 15 is formed in the substrate 11. Accordingly, there can be used, as a substrate, a single metal material such as tungsten or iron instead of stainless steel, or a semiconductor such as silicon.

Figure 2A:
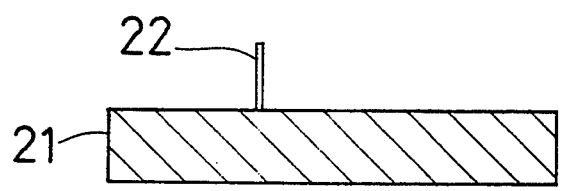
FIGS. 2(a)–2(c) are section views illustrating the respective steps of a stencil mask producing method according to a second embodiment of the present invention.
Figure 2B:
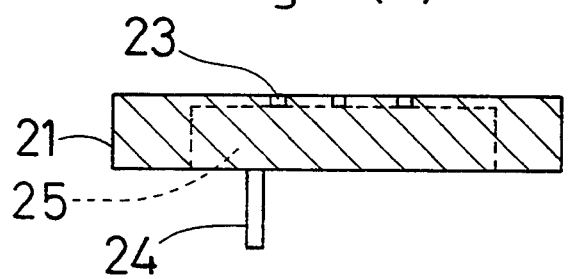
Figure 2C:
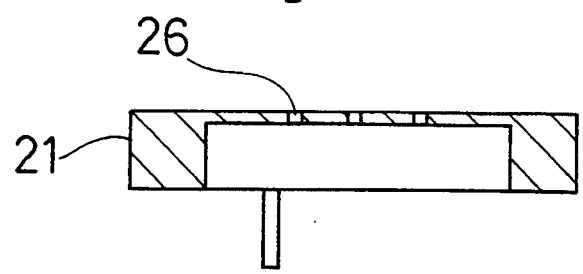

The following description will discuss a second embodiment of the present invention with reference to FIGS. 2(a)–2(c).

FIGS. 2(a)–2(c) are section views illustrating the respective steps of the stencil mask producing method according to the second embodiment of the present invention.

As a substrate 21, silicon is used. As shown in FIG. 2(a), the substrate 21 is subjected to electro-discharge machining using an electro-discharge-machining electrode 22 having a small diameter of 4 μm, thus forming a pattern having a predetermined configuration on the surface of the substrate 21. The pattern thus formed is then etched using an electro-discharge-machining electrode 22. There is thus formed, in the region other than the edge of the substrate 21, a concave pattern 23 which has vertical concaves each having a depth of about 20 to about 30 μm, as shown in FIG. 2 (b).

The reverse side of the substrate 21 is subjected to electro-discharge machining using an electro-discharge-machining electrode 24 having a great diameter of about 10 μm, thus removing a hatched portion 25 which is the region other than the edge of the reverse side of the substrate 21. Accordingly, the other part than the edge of the substrate 21 is thinned to a thickness of 20 to 30 μm. By this etching, the concave pattern 23 is opened at the bottom thereof, thus forming a through-hole pattern 26 in the other than the edge of the substrate 21.

Thus, while the processing steps are considerably simplified, there can be obtained a stencil mask excellent in mechanical strength by using, as a mask material, the substrate 21 solely made of silicon. The stencil mask thus obtained is made solely by silicon. Accordingly, even though an electron beam having an accelerating voltage of 50 keV is irradiated to the stencil mask, the stencil mask is not thermally distorted and is therefore very high in thermal stability.

According to the second embodiment having the arrangement above-mentioned, by subjecting the substrate 21 solely made of silicon to an electro-discharge technology, produce a practical stencil mask for reduction projection printing lithography which is excellent in mechanical strength and thermal stability and which is not thermally distorted. According to the second embodiment, the substrate 21 is subjected, at the reverse side thereof, to an electro-discharge technology to etch the reverse side of the substrate 21. Accordingly, the thickness of the substrate 21 can be controlled with high precision. By an electro-discharge technology, the substrate 21 is thinned and the through-hole pattern 26 is formed in the substrate 21. Accordingly, there can be used, as a substrate, a single metal material such as tungsten or stainless steel, instead of silicon.

The following description will discuss a third embodiment of the present invention with reference to FIGS. 3(a)–3(e).

FIGS. 3(a)–(e) are section views illustrating the respective steps of the stencil mask producing method according to the third embodiment of the present invention.

Figure 3A:
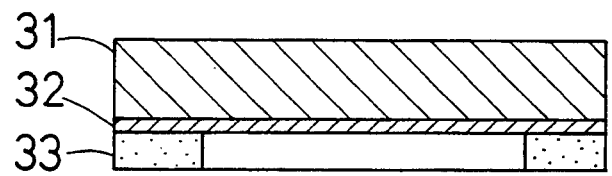
FIGS. 3(a)–3(c) are section view illustrating the respective steps of a stencil mask producing method according to a third embodiment of the present invention.

As a substrate 31, silicon is used. As shown in FIG. 3(a), an inorganic film 32 made of a silicon oxide film having a thickness of 300 nm is formed on the reverse side of the substrate 31. By lithography, a resist pattern 33 is formed at the edge of the reverse side of the inorganic film 32.

Figure 3B:
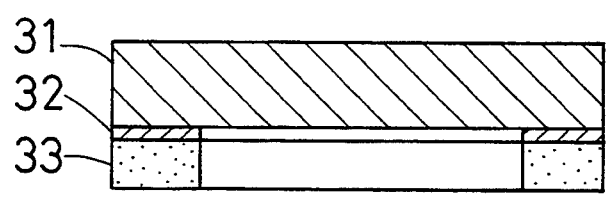

With the resist pattern 33 serving as a mask, the inorganic film 32 is selectively etched such that the region than the edge of the reverse side of the substrate 31 is exposed, as shown in FIG. 3(b).

Figure 3C:
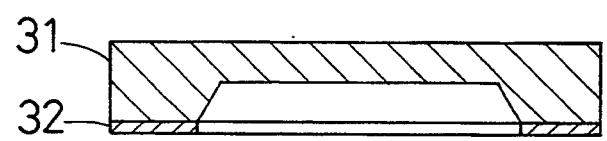

With the resist pattern 33 serving as a mask, the reverse side of the substrate 31 is wet-etched with the use of an ethylene diamine-pirocatechol solution. Accordingly, the substrate 31, except for the edge thereof, is thinned to a thickness of 20 to 30 μm, as shown in FIG. 3(c).

Figure 3D:
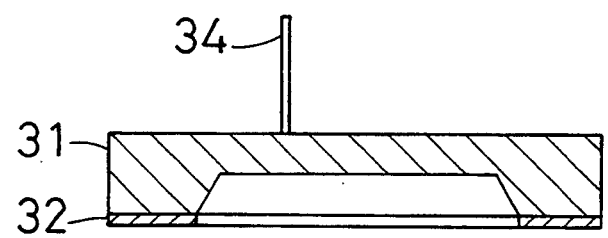
Figure 3E:
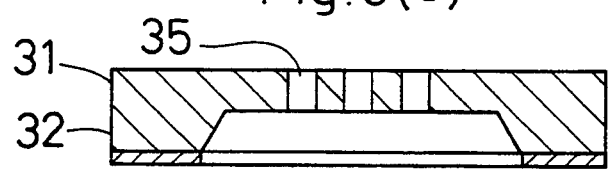

As shown in FIG. 3(d), the surface of the substrate 31 is subjected to electro-discharge machining using an electro-discharge-machining electrode 34 having a diameter of 4 μm. Thus, a pattern having a predetermined configuration is formed on the substrate 31, except for the edge thereof, as shown in FIG. 3 (e). The pattern thus formed is then etched with the use of the electro-discharge-machining electrode 34, thus forming a through-hole pattern 35.

Thus, while the processing steps are considerably simplified, there can be obtained a stencil mask excellent in mechanical strength by using, as a mask material, the substrate 31 solely made of silicon. Accordingly, even though an electron beam having an accelerating voltage of 50 keV is irradiated to the stencil mask, the stencil mask is not thermally distorted and is therefore very high in thermal stability.

According to the third embodiment having the arrangement above-mentioned, by subjecting the substrate 31 solely made of silicon to an electro-discharge technology, there can be produced a practical stencil mask for reduction projection printing lithography which is excellent in mechanical strength and thermal stability and which is not thermally distorted. According to the third embodiment, the reverse side of the substrate 31 is etched with an ethylene diamine-pirocatechol solution. However, after the etching processing, the reverse side of the substrate 31 may be polished so that the thickness of region other than the edge of the substrate 31 can be controlled with high precision.

The following description will discuss a fourth embodiment of the present invention with reference to (FIGS. 4(a)–4(e).

FIGS. 4(a)–4(e) are section views illustrating the respective steps of the stencil mask producing method according to the fourth embodiment of the present invention.

Figure 4A:
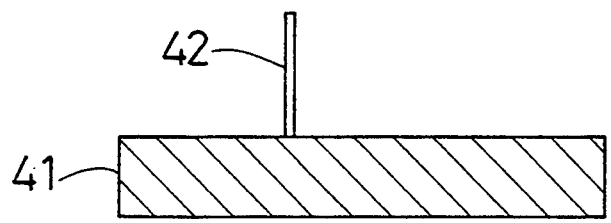
FIGS. 4(a)–4(e) are section views illustrating the respective steps of a stencil mask producing method according to a fourth embodiment of the present invention.

As a substrate 41, silicon is used. As shown in FIG. 4(a), the surface of the substrate 41 is subjected to electro-discharge machining using an electro-discharge-machining electrode 42 having a small diameter of 4 μm, thus forming a pattern having a predetermined configuration on the surface of the substrate 41. The pattern thus formed is then etched using the electro-discharge-machining electrode 42. Accordingly, there is formed, in the region other than the edge of the substrate 41, a concave pattern 43 having vertical concaves each having a thickness of 20 to 30 μm, as shown in FIG. 4(b).

Figure 4B:
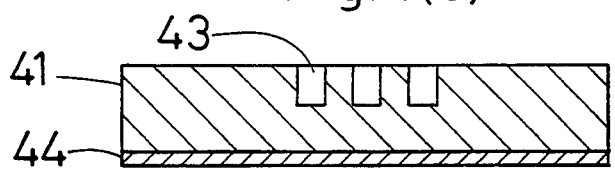
Figure 4C:
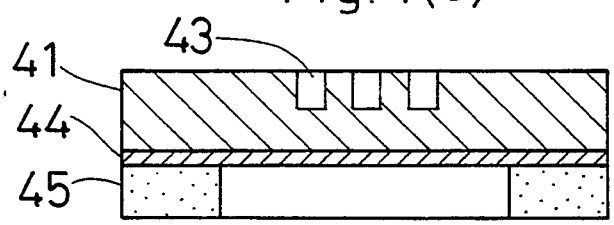

As shown in FIG. 4(b), an inorganic film 44 made of a silicon oxide film having a thickness of 300 nm is formed at the reverse side of the substrate 41. By lithography, a resist pattern 45 is formed at the edge of the reverse side of the inorganic film 44, as shown in FIG. 4(c).

Figure 4D:
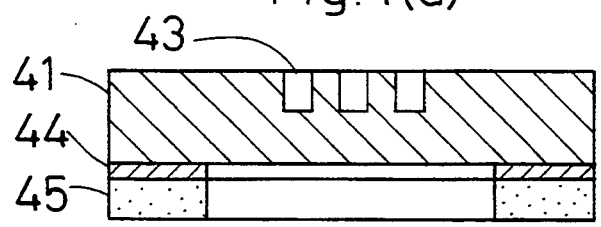

With the resist pattern 45 serving as a mask, the inorganic film 44 is selectively etched such that the region other than the edge of the reverse side of the substrate 41 is exposed, as shown in FIG. 4(d).

Figure 4E:
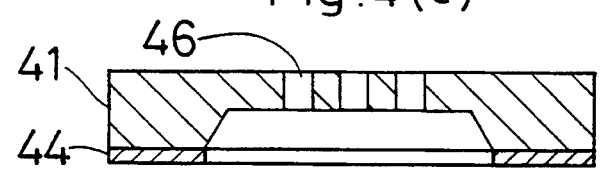
Figure 5:
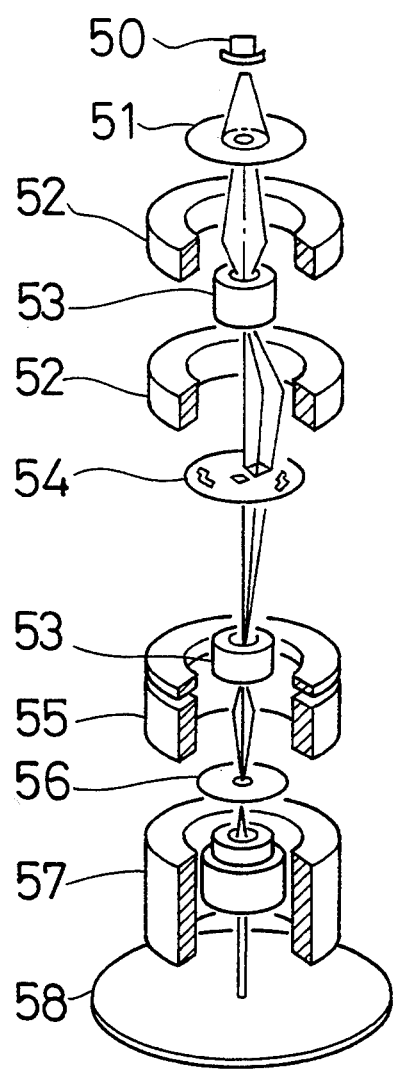
FIG. 5 is a schematic view illustrating a method of printing a pattern formed in a stencil mask on a wafer by an electron beam.
Figure 6A:
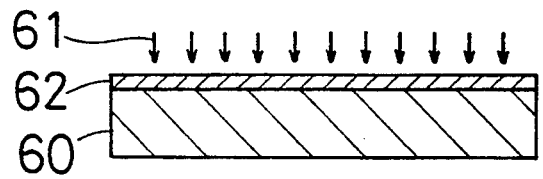
FIG. 6 is a section view illustrating the respective steps of a conventional stencil mask producing method.
Figure 6B:
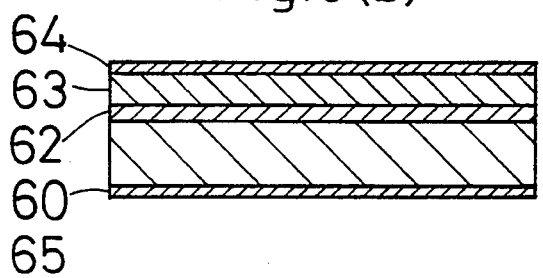
Figure 6C:
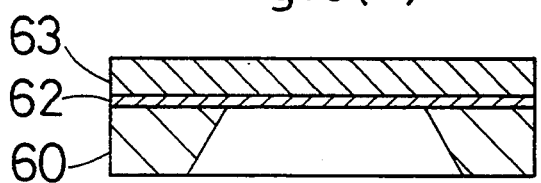
Figure 6D:
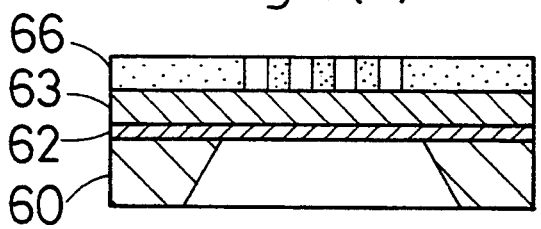
Figure 6E:
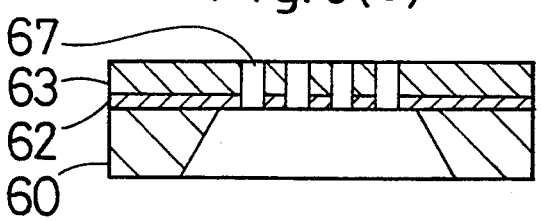
Figure 7:
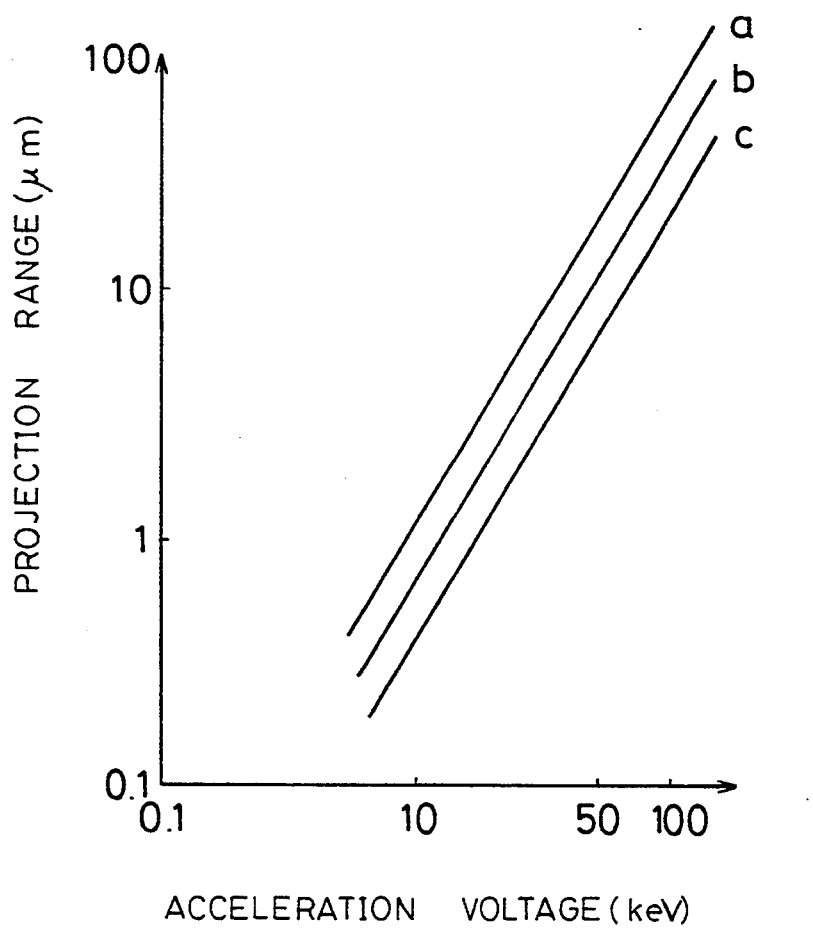
FIG. 7 is a view showing the projection ranges of electrons inside of silicon, tungsten, gold and stainless steel with respect to the accelerating voltages of an electron beam.

With the resist pattern 45 serving as a mask, the reverse side of the substrate 41 is then wet-etched with the use of an ethylene diamine-pirocatechol solution. Accordingly, the region other than the edge of the substrate 41 is thinned to a thickness of 20 to 30 μm, as shown in FIG. 4(e). This wet-etching causes the bottom of the concave pattern 43 to be opened, thus forming a through-hole pattern 46 in the region other part than the edge of the substrate 41.

According to the fourth embodiment having the above-mentioned arrangement, by subjecting the substrate 41 solely made of silicon to an electro-discharge technology, produces a practical stencil mask for reduction projection printing lithography which is excellent in mechanical strength and thermal stability and which is not thermally distorted. According to the fourth embodiment, the reverse side of the substrate 41 is etched with the use of an ethylene diamine-pirocatechol solution. However, after the etching processing, the reverse side of the substrate 41 may be polished so that the thickness of the region other than the edge of the substrate 41 can be controlled with high precision.

What is claimed is:

1. A method of producing a stencil mask which is provided with plural through-hole patterns having a predetermined configuration and which is used for forming plural resist patterns on a resist on a semiconductor substrate by a high-energy beam or an electron beam which passes through said plural through-hole patterns, comprising:

a first step of selectively etching a first surface of a substrate to thin a region of said substrate other than the edge of said substrate; and a second step of selectively subjecting a second surface of the region of said substrate other than the edge of said substrate to electro-discharge machining using a slender electrode, thus forming plural through-hole patterns having a predetermined configuration in the region of said substrate other than the edge of said substrate.

2. A method of producing a stencil mask according to claim 1, wherein the first step comprises a step of selectively subjecting said first surface of said substrate to electro-discharge machining using a thick electrode.

3. A method of producing a stencil mask according to claim 2, wherein said substrate is made of a semiconductor or metal, and the region of said substrate other than the edge of said substrate is thinned to a thickness of 10 μm to 100 μm by the first step.

4. A method of producing a stencil mask according to claim 1, wherein:

said substrate is made of a semiconductor, and
   the first step comprises the steps of:
   forming an inorganic film on said first surface of said substrate;
   forming a resist pattern on the edge of said inorganic film by lithography;

etching and removing the region of said inorganic film other than the edge of said inorganic film with said resist pattern serving as a mask, thus causing the region of said substrate other than the edge of said substrate to be exposed; and wet-etching said first surface of said substrate, thus thinning the region of said substrate other than the edge of said substrate.

5. A method of producing a stencil mask which is provided with plural through-hole patterns having a predetermined configuration and which is used for forming plural resist patterns on a resist on a semiconductor substrate by a high-energy beam or an electron beam which passes through said through-hole pattern, comprising:

a first step of selectively subjecting a first surface of the substrate other than the edge of said substrate to electro-discharge machining using a slender electrode, thus forming plural concave patterns having a predetermined configuration in the region of said substrate other than the edge of said substrate; and a second step of selectively etching a second surface of said substrate, thus thinning the region of said substrate other than the edge of said substrate, so that said plural concave patterns are converted into plural through-hole patterns.

6. A method of producing a stencil mask according to claim 5, wherein the second step comprises a step of selectively subjecting said second surface of said substrate to electro-discharge machining using a thick electrode, thus thinning the region of said substrate other than the edge of said substrate.

7. A method of producing a stencil mask according to claim 6, wherein said substrate is made of a semiconductor or metal, and the region of said substrate other than the edge of said substrate is thinned to a thickness of 10 $\mu$m to 100 $\mu$m by the second step.

8. A method of producing a stencil mask according to claim 5, wherein:

said substrate is made of a semiconductor, and the second step comprises the steps of:

forming an inorganic film on the second surface of said substrate;

forming a resist pattern on the edge of said inorganic film by lithography;

etching and removing the region of said inorganic film other than the edge of said inorganic film with said resist pattern serving as a mask, thus causing the region of said substrate other than the edge of said substrate to be exposed; and wet-etching said second surface of said substrate, thus thinning the region of said substrate other than the edge of said substrate.

9. A method of producing a stencil mask which is provided with plural through-hole patterns having a predetermined configuration and which is used for forming plural resist patterns on a resist on a semiconductor substrate by a high-energy beam which passes through said plural through-hole patterns, comprising the steps of:

selectively etching in a first surface of a substrate made of a semiconductor to thin a region of said substrate other than the edge of said substrate by, forming an inorganic film on said first surface of said substrate, forming a resist pattern on the edge of said inorganic film by lithography, etching and removing the region of said inorganic film other than the edge of said inorganic film with said resist pattern serving as a mask, thus causing the region of said substrate edge of said substrate to be exposed, and wet-etching said first surface of said substrate, thus thinning the region of said substrate other than the edge of said substrate; and selectively subjecting a second surface of the region of said substrate other than the edge of said substrate to electro-discharge machining using a slender electrode, thus forming plural through-hole patterns having a predetermined configuration in the region of said substrate other than the edge of said substrate.

10. A method of producing a stencil mask which is provided with plural through-hole patterns having a predetermined configuration and which is used for forming plural resist patterns on a resist on a semiconductor substrate by a high-energy beam which passes through said through-hole pattern, comprising:

selectively subjecting a first surface of a substrate made of a semiconductor other than the edge of said substrate to electro-discharge machining using a slender electrode, thus forming plural concave patterns having a predetermined configuration in the region of said substrate other than the edge of said substrate; and selectively etching a second surface of said substrate, thus thinning the region of said substrate other than the edge of said substrate, so that said plural concave patterns are converted into plural through-hole patterns by, forming an inorganic film on the second surface of said substrate, forming a resist pattern on the edge of said inorganic film by lithography, etching and removing the region of said inorganic film other than the edge of said inorganic film with said resist pattern serving as a mask, thus causing the region of said substrate other than the edge of said substrate to be exposed, and wet-etching said second surface of said substrate thus thinning the region of said substrate other than the edge of said substrate.

* * * * *

UNITED STATES PATENT AND TRADEMARK OFFICE
CERTIFICATE OF CORRECTION

PATENT NO. : 5,401,932
DATED : March 28, 1995
INVENTOR(S) : Kazuhiko Hashimoto et al.

It is certified that error appears in the above-identified patent and that said Letters Patent is hereby corrected as shown below:

Column 2, Line 3: "6(a)-(c)." should read --6(a)-(e).--.

Column 2, Line 6: "cm" should read --$cm^{-2}$--.

Column 2, Line 33: "there a" should read --a--.

Column 2, Line 34: "in an" should read --in--.

Column 2, Line 45: "become dozen" should read --become a dozen--.

Column 2, Line 46: "are" should read --is--.

Column 2, Line 65: "of" should read --of a--.

Column 3, Line 11: "an" should read --a--.

Column 3, Line 13: "$10^{-6}$," should read --$10^{-6}$/deg,--.

Column 3, Line 50: "a electrode," should read --a slender electrode,--.

Column 3, Line 52: "other part" should read --other--.

Column 3, Line 55: "other part" should read --other--.

Column 4, Line 32: "the" (first occurrence) should read --that--.

Column 4, Line 45: "3(a)-3(c)" should read --3(a)-3(e)--, and "view" should read --views--.

UNITED STATES PATENT AND TRADEMARK OFFICE
CERTIFICATE OF CORRECTION

PATENT NO. : 5,401,932

DATED : March 28, 1995

INVENTOR(S) : Kazuhiko Hashimoto et al.

It is certified that error appears in the above-identified patent and that said Letters Patent is hereby corrected as shown below:

Column 4, Line 55: "FIG. 6 is a section view" should read --FIGS. 6(a)-6(e) are section views--.

Column 5, Line 29: "FIG. 1 is a section view" should read --FIGS. 1(a)-1(c) are section views--.

Column 6, Line 33: "the other part" should read --the region other--.

Column 6, Line 37: "the other" should read --the region other--.

Column 6, Line 51: "produce" should read --produces--.

Column 7, Line 10: "region" should read --region other--.

Column 7, Line 39: "there can be produced" should read --produces--.

Column 8, Line 18: "other part" should read --other--.

Signed and Sealed this

Twelfth Day of September, 1995

Attest:

BRUCE LEHMAN

*Attesting Officer*   *Commissioner of Patents and Trademarks*